US008557623B2

(12) United States Patent
Butler et al.

(10) Patent No.: US 8,557,623 B2
(45) Date of Patent: Oct. 15, 2013

(54) METHODS AND APPARATUSES FOR INTEGRATED PACKAGING OF MICROELECTROMECHANICAL DEVICES

(75) Inventors: Donald P. Butler, Colleyville, TX (US); Zeynep Celik-Butler, Colleyville, TX (US); Mohammad S. Rahman, South Bend, IN (US); Murali M. Chitteboyina, Arlington, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 228 days.

(21) Appl. No.: 12/818,001

(22) Filed: Jun. 17, 2010

(65) Prior Publication Data
US 2010/0320549 A1 Dec. 23, 2010

Related U.S. Application Data

(60) Provisional application No. 61/218,032, filed on Jun. 17, 2009.

(51) Int. Cl.
*H01L 21/00* (2006.01)
(52) U.S. Cl.
USPC ............... 438/51; 257/E21.499; 257/E29.324
(58) Field of Classification Search
USPC .................................... 438/51; 257/E29.324
See application file for complete search history.

(56) References Cited

U.S. PATENT DOCUMENTS

| 6,875,208 B2 * | 4/2005 | Santini et al. ............... 604/890.1 |
| 2004/0114259 A1 * | 6/2004 | Ishizuya et al. ............... 359/849 |

OTHER PUBLICATIONS

Lin, Liwei et al.; "Microelectromechanical Filters for Signal Processing"; Sep. 1998; IEEE Journal of Microelectromechanical Systems, vol. 7, No. 3; pp. 286-294.*
Cheng et al., "Localized silicon fusion and eutectic bonding for MEMS fabrication and packaging," *Journal of Microelectromechanical Systems*, 9:3-8, 2000.
Esashi, "Wafer level packaging of MEMS," *J. Micromech. Microeng.*, 18:1-13, 2008.
Hsu, "Packaging design of microsystems and meso-scale devices," *IEEE Transactions on Advanced Packaging*, 23:596-601, 2000.
Kim et al, Characterization of low-temperature wafer bonding using thin-film parylene, *Journal of Microelectromechanical Systems*, 14:1347-1355, 2005.
Lee et al., "A study on wafer level vacuum packaging for MEMS devices," *J. Micromech. Microeng.*, 13:663-669, 2003.
Lin, "MEM post-packaging by localized heating and bonding," *IEEE Transactions on Advanced Packaging*, 23:608-616, 2000.
Mahmood et al., "A device-level vacuum-packaging scheme for mcirobolometers on rigid and flexible substrates," *IEEE Sensors Journal*, 7:1012-1019, 2007.

(Continued)

*Primary Examiner* — Stephen W Smoot
*Assistant Examiner* — Vicki B Booker
(74) *Attorney, Agent, or Firm* — Fulbright & Jaworski LLP

(57) ABSTRACT

Microelectromechanical systems (MEMS) packages, packaged MEMS devices, and methods for making the same are disclosed. The method may include forming a chamber sacrificial layer above an insulating layer that is coupled to a wafer. The method further may include forming a packaging layer above the chamber sacrificial layer. The method additionally may include forming one or more openings through the packaging layer. The method also may include removing the chamber sacrificial layer through the one or more openings. The method may include forming a sealing layer above the packaging layer such that the sealing layer substantially seals the one or more openings to form a hermetic cavity.

6 Claims, 14 Drawing Sheets

(56) References Cited

OTHER PUBLICATIONS

Mastrangelo and Muller, "Vacuum-sealed silicon micromachined incandescent light source," In: Electron Devices Meeting, 1989. IEDM '89. Technical Digest., International, pp. 503-506, 1989.

Mitchell et al., "An improved performance poly-si pirani vacuum gauge using heat-distributing structural supports," *Journal of Microelectromechanical Systems*, 17:93-102, 2008.

Mitchell et al., "Encapsulation of vacuum sensors in a wafer level package using a gold-silicon eutectic," In: Solid-State Sensors, Actuators and Microsystems, 2005. Digest of Technical Papers. Transducers '05. The 13th International Conference, pp. 928-931, Jun. 5-9, 2005.

Park et al., "Wafer-scale film encapsulation of micromachined accelerometers," In: Transducers, Solid-State Sensors, Actuators and Microsystems, 12th International Conference, pp. 1903-1906, Jun. 8-12, 2003.

Sparks et al., "Long-term evaluation of hermetically glass frit sealed silicon to Pyrex wafers with feedthroughs," *J. Micromech. Microeng.*, 15:1560-1564, 2005.

Tilmans et al., "The indent reflow sealing (IRS) technique—a method for the fabrication of sealed cavities for MEMS devices," *Journal of Microelectromechanical Systems*, 9:206-217, 2000.

Tsuchiya et al., "Polysilicon vibrating gyroscope vacuum-encapsulated in an on-chip micro chamber," *Sensors and Actuators*, 90:49-55, 2001.

Yang et al., "Localized induction heating solder bonding for wafer level MEMS packaging," In: Micro Electro Mechanical Systems, 2004. 17th IEEE International Conference, pp. 729-732, 2004.

Yoon et al., "Micromachined integrated shock protection for MEMS," *Senors and Actuators*, 130-131:166-175, 2006.

Young et al., "A novel low-temperature method to fabricate MEMS resonators using PMGI as a sacrificial layer," *J. Micromech. Microeng.*, 15:1824-1830, 2005.

Bartek et al., "Vacuum sealing of microacvities using metal evaporation," *Sensors and Actuators*, 61:364-368, 1997.

\* cited by examiner

METHODS AND APPARATUSES FOR INTEGRATED PACKAGING OF MICROELECTROMECHANICAL DEVICES

CROSS-REFERENCE TO RELATED APPLICATIONS

This application claims priority to U.S. Provisional Application No. 61/218,032 filed Jun. 17, 2009, which is specifically incorporated herein by reference in its entirety without disclaimer.

BACKGROUND

1. Field of the Invention

The present invention relates generally to microelectromechanical systems (MEMS), and more particularly, but not by way of limitation, to a MEMS device fabrication process.

2. Brief Description of Related Art

Packaging of MEMS devices may be challenging. As sensors, MEMS devices may be required to be exposed to the agent(s) that they are intended to detect. As actuators, geometrically complex moving parts may need protection. Moreover, certain MEMS devices and/or their components may have specific packaging requirements (e.g., optical window, sealed environment, etc.). As a result, MEMS devices may be especially sensitive to damage and contamination during the fabrication and/or packaging processes. For example, certain MEMS devices may include fragile movable parts or may need to be operated with a specific environmental characteristics, and, as a result, standard packaging technologies (e.g., for integrated circuits) may not be effective or financially practical for MEMS devices. Certain RF-MEMS devices such as varactors, switches, resonators, and/or the like may respond mechanically to some electrical input signal. Traditional MEMS packaging methods have generally been performed at an overall die level after manufacturing of the MEMS device.

SUMMARY

Methods for creating microelectromechanical systems (MEMS) packaging are disclosed. In some embodiments, the method includes forming a chamber sacrificial layer above an insulating layer that is coupled to a wafer. In some embodiments, the method includes forming a packaging layer above the chamber sacrificial layer. In some embodiments, the method includes forming one or more openings through the packaging layer. In some embodiments, removing the chamber sacrificial layer through the one or more openings. In some embodiments, the method includes forming a sealing layer above the packaging layer such that the sealing layer substantially seals the one or more openings to form a hermetic cavity.

In some embodiments, the method includes forming the insulating layer before forming the chamber sacrificial layer. The insulating layer includes $SiO_2$, $Si_3N_2$, and/or $Al_2O_3$. In some embodiments, the method includes forming a resonator above the insulating layer. In some embodiments, forming a resonator includes forming one or more conductive layers above the insulating layer. In some embodiments, forming a resonator includes forming a gap sacrificial layer above the one or more conductive layers. In some embodiments, forming a resonator includes forming a resonator beam above the gap sacrificial layer after forming the one or more conductive layers. In some embodiments, forming a resonator includes removing the gap sacrificial layer to form an air gap under the resonator beam. In some embodiments, forming the resonator is performed prior to forming the chamber sacrificial layer.

In some embodiments, forming the one or more conductive layers includes forming an electrode, a first anchor, and a second anchor. In some embodiments, the one or more conductive layers includes a titanium layer and a gold layer. In some embodiments, forming the gap sacrificial layer includes curing the gap sacrificial layer. In some embodiments, removing the gap sacrificial layer includes plasma ashing. In some embodiments, plasma ashing includes oxygen plasma ashing. In some embodiments, forming the chamber sacrificial layer includes curing the chamber sacrificial layer. In some embodiments, forming the packaging layer includes depositing $Al_2O_3$. In some embodiments, removing the chamber sacrificial layer includes plasma ashing. In some embodiments, plasma ashing includes oxygen plasma ashing. In some embodiments, forming the sealing layer includes forming a layer of $Al_2O_3$ at a pressure below 10 Torr. In some embodiments, the method includes etching the sealing layer to expose a portion of one or more bond pads in the one or more conductive layers.

Microelectromechanical systems (MEMS) packages prepared by a process are disclosed. In some embodiments, the process includes forming a chamber sacrificial layer above an insulating layer that is coupled to a wafer. In some embodiments, the process includes forming a packaging layer above the chamber sacrificial layer. In some embodiments, the process includes forming one or more openings through the packaging layer. In some embodiments, the process includes removing the chamber sacrificial layer through the one or more openings. In some embodiments, forming a sealing layer above the packaging layer such that the sealing layer substantially seals the one or more openings to from to form a hermetic cavity.

In some embodiments, the process includes forming the insulating layer before forming the chamber sacrificial layer. In some embodiments, the insulating layer includes $SiO_2$, $Si_3N_2$, and/or $Al_2O_3$.

In some embodiments, the process includes forming a resonator above the insulator layer. In some embodiments, forming the resonator includes forming one or more conductive layers above the insulating layer. In some embodiments, forming the resonator includes forming a gap sacrificial layer above the one or more conductive layers. In some embodiments, forming the resonator includes forming a resonator beam above the gap sacrificial layer after forming the one or more conductive layers. In some embodiments, forming the resonator includes removing the gap sacrificial layer to form an air gap under the resonator beam. In some embodiments, forming the resonator is performed prior to forming the chamber sacrificial layer.

In some embodiments, forming the one or more conductive layers includes forming an electrode, a first anchor, and a second anchor. In some embodiments, the one or more conductive layers includes a titanium layer and a gold layer. In some embodiments, forming the gap sacrificial layer includes curing the gap sacrificial layer. In some embodiments, removing the gap sacrificial layer includes plasma ashing. In some embodiments, forming the chamber sacrificial layer comprises curing the chamber sacrificial layer.

Microelectromechanical systems (MEMS) packages are disclosed. In some embodiments, a package includes an insulating layer. In some embodiments, a package includes a packaging-sealing layer formed above the insulating layer, having one or more sealed openings, and configured to form a hermetic cavity within the MEMS package. In some embodiments, the interior of the hermetic cavity may have a pressure below 10 Torr.

In some embodiments, a package includes one or more conductive layers formed above the insulating layer. In some embodiments, a package includes a resonator beam formed within the hermetic cavity, coupled to the one or more conductive layers, and configured to form an air gap between the resonator beam and the insulating layer. In some embodiments, the insulating layer includes SiO2, $Al_2O_3$, and/or $Si_3N_2$. In some embodiments, packaging layer includes $Al_2O_3$. In some embodiments, the sealing layer includes $Al_2O_3$. In some embodiments, the one or more conductive layers includes titanium and/or gold. In some embodiments, the resonator beam includes titanium and/or $Al_2O_3$. In some embodiments, the one or more bond pads are exposed.

In some embodiments, the steps or portions of the present methods and processes may all be performed within one or more chambers and/or without being exposed to atmospheric pressures. For example, the present MEMS devices may be fabricated within a clean room, and in some embodiments, may be packaged (e.g., a hermetic chamber may be formed) before leaving the clean room. In some embodiments, the present methods and processes may be performed, and/or the present MEMS devices may be packaged, before wafer/die separation. The present MEMS devices may also be integrated with CMOS devices on the same die. In some embodiments, the MEMS devices (or a portion of a MEMS device, such as, a resonator beam) may be packaged (e.g., a hermetic chamber may be formed around the device or portion of the device) before integration with an additional device or devices.

The term "substantially" and its variations are defined as being largely but not necessarily wholly what is specified as understood by one of ordinary skill in the art. For example, in some embodiments, "substantially" refers to and/or may be substituted with "within [a percentage] of" what is specified, where the percentage includes 15, 10, 5, 1, and/or 0.5% percent.

Any embodiment of any of the present methods and devices can consist of or consist essentially of—rather than comprise/include/contain/have—any of the described steps, elements, and/or features. Thus, in any of the claims, the term "consisting of" or "consisting essentially of" can be substituted for any of the open-ended linking verbs recited above, in order to change the scope of a given claim from what it would otherwise be using the open-ended linking verb.

Details associated with the embodiments described above and others are presented below.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers.

DETAILED DESCRIPTION OF ILLUSTRATIVE EMBODIMENTS

The term "coupled" is defined as connected, although not necessarily directly, and not necessarily mechanically; two items that are "coupled" may be unitary with each other. The terms "a" and "an" are defined as one or more unless this disclosure explicitly requires otherwise. The term "substantially" is defined as largely but not necessarily wholly what is specified (and includes what is specified; e.g., substantially 90 degrees includes 90 degrees and substantially parallel includes parallel), as understood by a person of ordinary skill in the art.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a device that "comprises," "has," "includes" or "contains" one or more elements possesses those one or more elements, but is not limited to possessing only those elements. Likewise, a method that "comprises," "has," "includes" or "contains" one or more steps possesses those one or more steps, but is not limited to possessing only those one or more steps.

Further, a device or structure that is configured in a certain way is configured in at least that way, but it can also be configured in other ways than those specifically described.

Figure 1A:
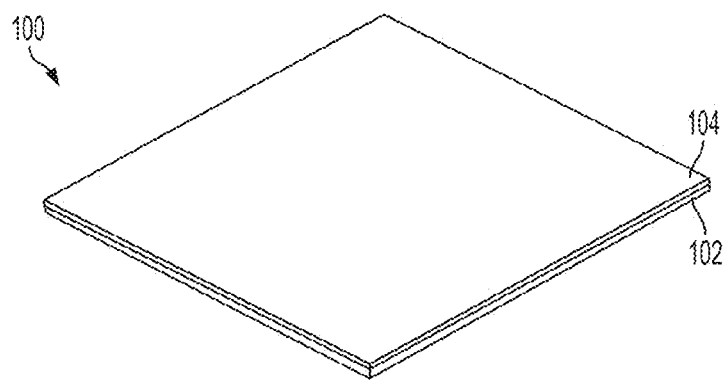
FIGS. 1A-1E illustrate intermediate steps in the fabrication of one embodiment of the present MEMS package.

The present disclosure includes microelectromechanical systems (MEMS) packages (e.g., integrated), packaged MEMS, and methods for packaging (e.g., simultaneously or integrally with manufacturing) MEMS devices. FIG. 1A depicts an (e.g., intermediate) stage or step in one of the present methods of packaging one embodiment 100 of a MEMS device. In some embodiments, the method of fabrication may begin with (e.g., providing a) silicon wafer 102. In some embodiments, MEMS package 100 begins on a rectangular-shaped silicon wafer, as shown in the depicted embodiment. In some embodiments, several MEMS packages may be simultaneously fabricated on a round silicon wafer. Some embodiments comprise cleaning silicon wafer 102 (e.g., with a standard TAMDI de-greasing procedure).

In some embodiments, insulating layer 104 may be coupled to (e.g., formed above) the insulating layer, as further depicted in FIG. 1A. As shown in the depicted embodiment, the insulating layer may be formed directly on top of the silicon wafer. Insulating layer 104 may be coupled to the wafer. In some embodiments, additional layers may also be present between silicon wafer 102 and insulating layer 104. In some embodiments, insulating layer 104 may include silicon dioxide ($SiO_2$). In some embodiments, insulating layer 104 may have a thickness of approximately 600 nm (e.g., between 550 nm and 650 nm, between 575 and 625, and/or between 590 and 610 nm), and/or may be formed by a wet thermal oxidation process. In some embodiments, insulating layer 104 can have a thickness of equal to, greater than, or between, any of: 400, 425, 450, 475, 500, 525, 550, 575, 600, 625, 650, 675, 700, 725, 750, 775, and/or 800 nm. In some embodiments, a Tystar Oxidation furnace may be used to form the $SiO_2$ from the silicon wafer (e.g., to oxidize an outer surface of the silicon wafer to form an insulating layer 104 of $SiO_2$).

Figure 1B:
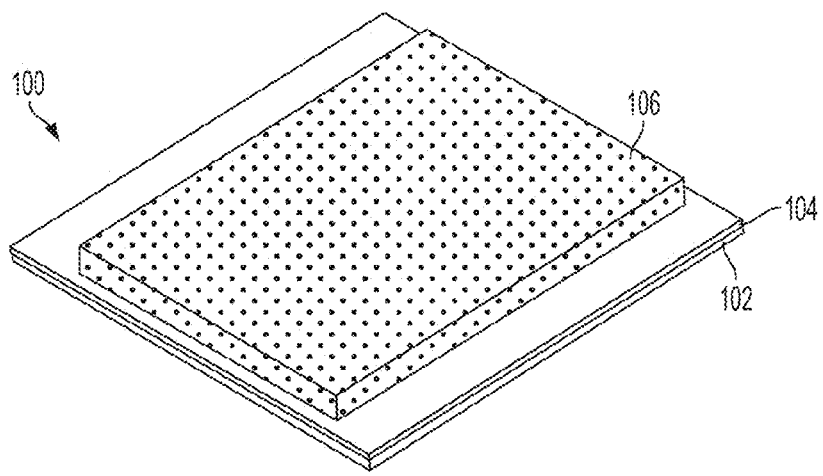

FIG. 1B depicts an additional (e.g., intermediate) stage or step in the method of fabrication of MEMS package 100. In the embodiment shown, a chamber sacrificial layer 106 is formed above insulating layer 104. As shown in the depicted embodiment, chamber sacrificial layer 106 may be formed directly on top of the insulating layer 104. Chamber sacrificial layer 106 may have a smaller area than insulating layer 104, and/or may be rectangular in shape, as shown. Chamber sacrificial layer 106 can include any suitable material that permits the chamber sacrificial layer to be removed, as described below. For example, chamber sacrificial layer 106 can comprise polymide. In some embodiments, the polymide may be PI 2737 from HD Microsystems. In the present embodiments, polymide can be configured or used for relatively low temperature encapsulation that is suitable for packaging a wide variety of MEMS (e.g., including various metallic or other structures that may be temperature-sensitive).

In some embodiments, for example, the polymide layer may be formed by a spin coating process at 1450 rpm (e.g., for 60 seconds), and/or may be baked on a hot plate (e.g., at 70° C. for 3 minutes, and at 100° C. for another 3 minutes). Subsequently, the polymide layer may be exposed to air (e.g., ambient air in a manufacturing chamber) for a period of time (e.g., 16 seconds). In some embodiments, the polymide layer may be developed with or in a developer (e.g., DE 9040, available from HD Microsystems, U.S.A.) and rinsed (e.g., RI 9180, available from HD Microsystems, U.S.A.). For example, in some embodiments, the polymide layer may be developed in 100% DE 9040 for 11 seconds and then developed in 50% DE 9040 and 50% RI 9180 for 11 seconds. At this stage, the entire wafer may be immersed in a first beaker of RI 9180 for 11 seconds, and then subsequently immersed in a second beaker of RI 9180 for 11 seconds. The polymide layer may then be dried with nitrogen ($N_2$).

In some embodiments, forming chamber sacrificial layer 106 may include curing it. For example, in some embodiments, chamber sacrificial layer 106 may be cured in an oven. In some embodiments, the curing process may begin in an oven for with temperature increasing from 25° C. to 300° C. over a first period of time (e.g. one hour). Chamber sacrificial layer 106 may subsequently be cured at 300° C. for a second period of time (e.g., 3 hours and 45 minutes). Chamber sacrificial layer 106 may subsequently be cooled from 300° C. to 25° C. over a third period of time (e.g., 1 hour). For some embodiments, the oven can comprise a BLUE-M oven (available from Thermal Product Solutions, New Columbia, Pa., USA). In some embodiments, curing chamber sacrificial layer 106 reduces its thickness. For example, in some embodiments, the thickness is reduced from 4.5 µm to 3.1 µm. In other embodiments, the thickness could be reduced from approximately 5 µm to 2.5 µm. In some embodiments, the chamber sacrificial layer is cured to a thickness of 3 µm.

Figure 1C:
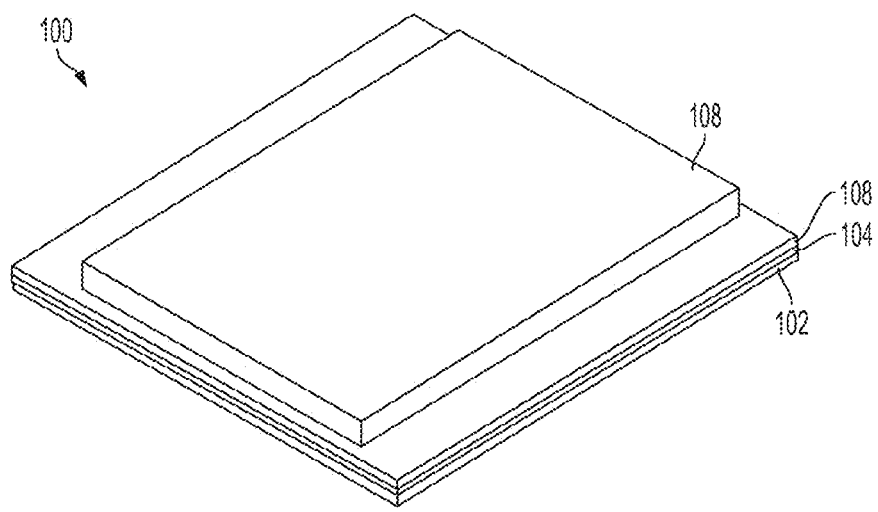

FIG. 1C depicts an additional (e.g., intermediate) stage or step in the present method of fabricating MEMS device 100. In some embodiments, a packaging layer 108 may be formed above chamber sacrificial layer 106. In the embodiment shown, packaging layer 108 is formed above both chamber sacrificial layer 106 and insulating layer 104. As shown, packing layer 108 may be coupled to insulating layer 104 and/or chamber sacrificial layer 106 (e.g., during this stage). In some embodiments, packaging layer 108 comprises aluminum oxide ($Al_2O_3$). In some embodiments, packaging layer 108 may, additionally or alternatively, comprise: silicon, silicon oxide, silicon oxynitride, silicon nitride, and/or other insulative materials. Packaging layer 108 may be formed by an RF sputtering process. In some embodiments, this process may be performed at a subatmospheric pressure (e.g., a substantially vacuum pressure, such as 5 mTorr. The RF sputtering process may, for example, be performed with an AJA sputter system, powered at 150 W for 12 hours. In some embodiments, packaging layer 108 may be 0.8 µm thick (e.g., between 750 nm and 850 nm, between 775 and 825, and/or between 790 and 810 nm). In some embodiments, insulating layer 104 can have a thickness of equal to, greater than, or between, any of: 600, 625, 650, 675, 700, 725, 750, 775, 800, 825, 850, 875, 900, 925, 950, 975, and/or 1000 nm.

Figure 1D:
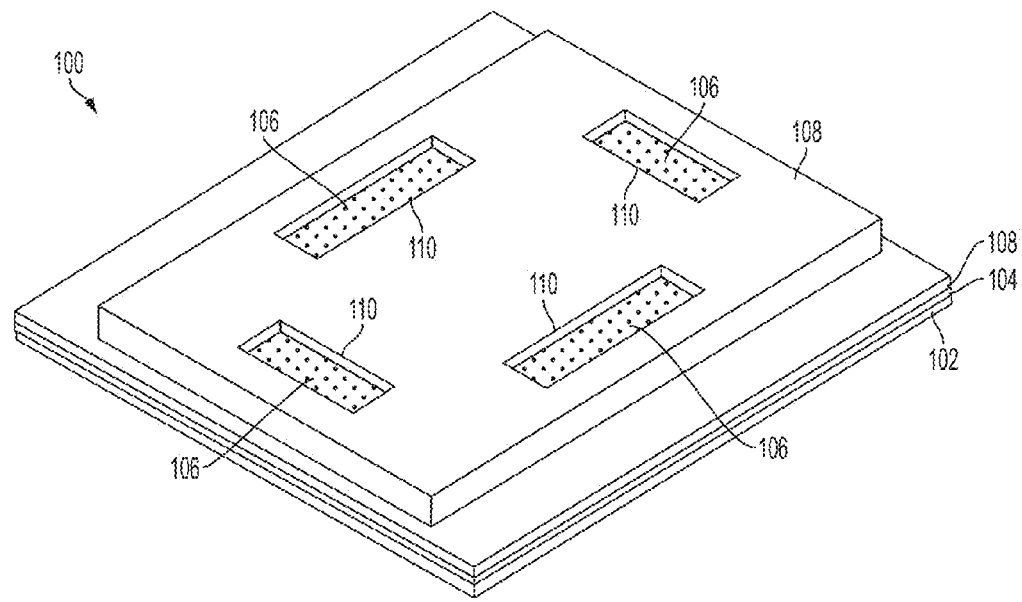

FIG. 1D depicts an additional (e.g., intermediate) stage or step in the present method of fabricating MEMS device 100. In some embodiments, one or more openings 110 are formed through the packaging layer. One or more openings 110 may also be referred as "trench cuts." As shown in the depicted embodiment, one or more openings 110 may be formed in or through packaging layer 108 such that chamber sacrificial layer 106 is revealed or exposed below packaging layer 108. In some embodiments, openings 110 may be rectangularly shaped, but the openings need not take this shape and may instead comprise any suitable shape that permits sacrificial layer 106 to be removed as described below. One or more openings 110 may, for example, be formed by a photolithography process. In some embodiments, photoresist may be applied above packaging layer 106, one or more openings 110 may be etched after using a photomask, and excess photoresist may then be removed.

For example, in some embodiments, photoresist (e.g., NR9-1500PY, available from Futurrex Inc., U.S.A.) may be applied using a spin coat process at 2500 rpm (e.g., for 40 seconds). The photoresist may also be baked on a hot plate (e.g., at 150° C. for 60 seconds). The photoresist may then be exposed using an OAI mask aligner (e.g., for 11 seconds). The photoresist may further be post-baked on a hot plate (e.g., at 100° C. for 60 seconds) and developed in a developer (e.g.

RD6 available from HD Microsystems, U.S.A.), such as, for example, for 14 or more seconds. The entire wafer can be placed in a stripper bath (e.g., for up to 20 hours) to remove the excess photoresist. In some embodiments, ultrasonic agitation may be used to ensure that one or more openings 110 are open. MEMS device 100 may be rinsed in methanol and/or dried with nitrogen gas.

Figure 1E:
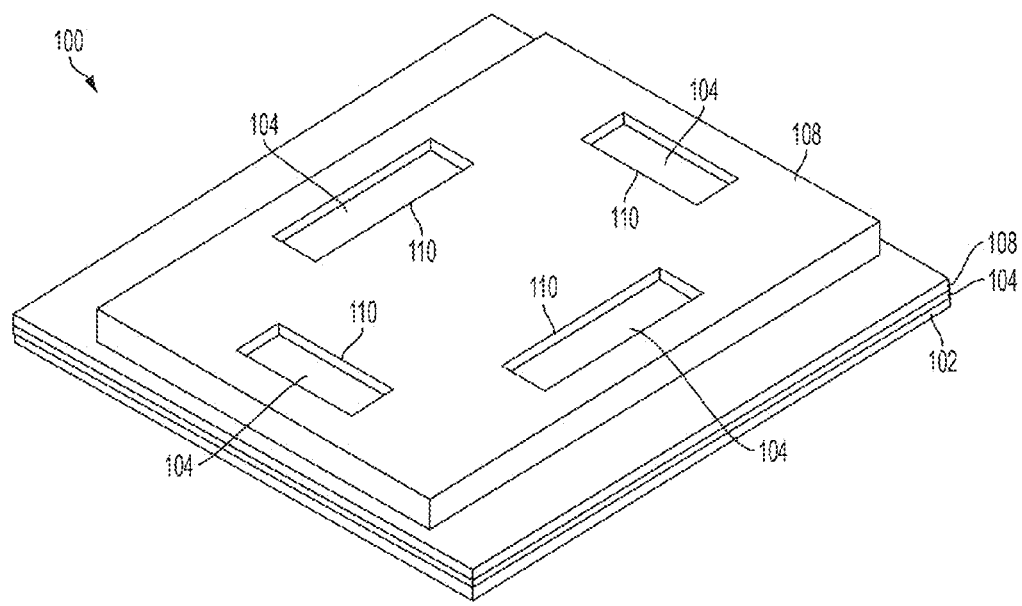

FIG. 1E depicts an additional (e.g., intermediate) stage or step in the present method of fabricating MEMS device 100. In some embodiments, chamber sacrificial layer 106 may be removed through the one or more openings. As shown in the depicted embodiment, removing chamber sacrificial layer 106 can reveal insulating layer 104 through one or more openings 110. Removal of chamber sacrificial layer may create a chamber (e.g., or cavity) within MEMS device 100. In some embodiments, removal of chamber sacrificial layer may be performed with a plasma ashing process. The plasma ashing process may include the use of oxygen-based plasma and is stiction free. For example, the removal may be performed with a Diener Asher (e.g., at 150 W in a 0.6 mBar chamber). Alternatively, removal may be accomplished with wet-etching or other techniques known in the art. Wet-etching techniques may be faster than other alternatives including plasma ashing. Subsequent to the removal process, MEMS device 100 may be inspected to verify the removal of chamber sacrificial layer 106. The removal of the chamber sacrificial layer may be confirmed through the pull down of the resonator beam (due to the electrostatic actuation between the resonator beam and the electrode).

Figure 1F:
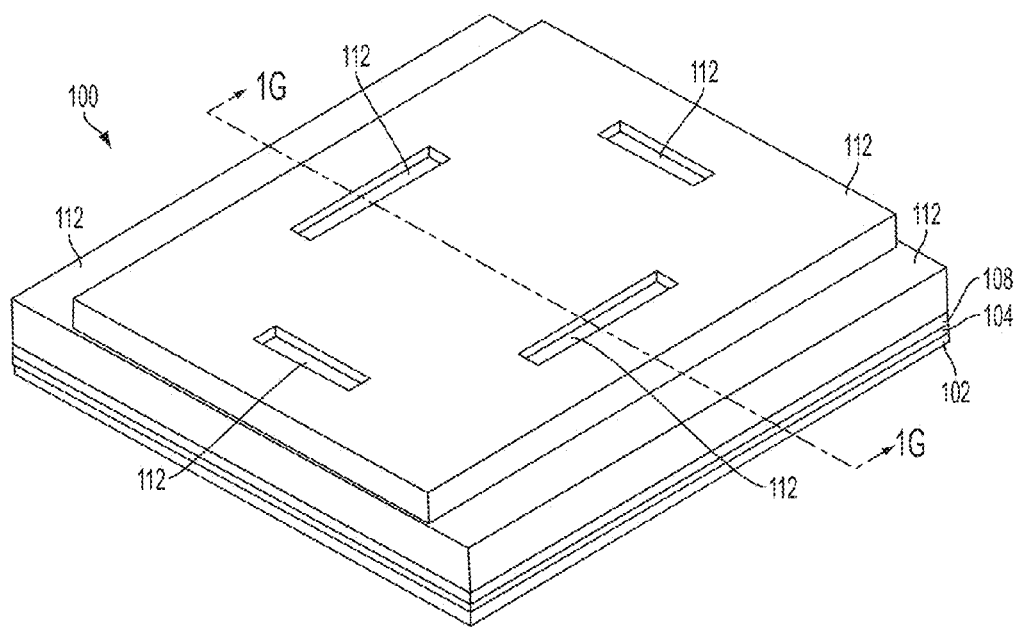
FIG. 1F illustrates one embodiment of the present MEMS package.

FIG. 1F depicts an additional (e.g., final) stage or step in the present method of fabricating MEMS device 100. In some embodiments, sealing layer 112 may be formed above packaging layer 108 such that sealing layer 112 substantially seals the one or more openings to form a hermetic cavity. As shown in the depicted embodiment, sealing layer 112 may be formed directly on top of packaging layer 108. In some embodiments, the sealing layer substantially covers the package layer. Sealing layer 112 may be coupled with packaging layer 108, and/or the two layers may be indistinguishably coupled together. Also as shown in the present embodiment, sealing layer 112 may close one or more openings 110. The forming of sealing layer 112 may form a hermetic cavity. A hermetic cavity is a sealed cavity (e.g., a hermetically sealed cavity).

The pressure within the hermetic cavity may be substantially similar to the external pressure of the chamber in which sealing layer 112 is applied. For example, sealing layer 112 may be applied a substantially low pressure (e.g., at 5 mT) in a chamber, and thus the pressure of the formed hermetic cavity may be substantially close to a vacuum (e.g., close to 5 mT). For many applications, the pressure of the hermetic cavity may range from 5 mT to 10 T. In some embodiments, sealing layer 112 may be formed at a pressure, greater than, or between, any of 50 mT, 100 mT, 200 mT, 300 mT, 400 mT, 500 mT, 600 mT, 700 mT, 800 mT, 900 mT, 1 T, 2 T, 3 T, 4 T, 5 T, 6 T, 7 T, 8 T, 9 T, and 10 T. In some embodiments, sealing layer 112 may be formed with $Al_2O_3$, and alternatively, silicon, silicon oxide, silicon oxynitride, silicon nitride, or other insulative materials may be used. The use of $Al_2O_3$ may be optically transparent, and thus its use may create an optically transparent window into the newly created hermetic chamber. Sealing layer 112 may formed with a 3.5 μm thickness (e.g., between 3.25 μm and 3.75 μm, or between 3.4 μm and 3.6 μm). In some embodiments, sealing layer 112 can have a thickness of equal to, greater than, or between, any of: 1.5, 1.75, 2, 2.25, 2.5, 2.75, 3, 3.25, 3.5, 3.75, 4, 4.25, 4.5, 4.75, 5, 5.25, and/or 5.5 μm. In some embodiments, sealing layer 112 may be formed with an sputtering process, such as, for example, by or with an AJA sputtering system with 150 W power. Sealing layer 112 may be formed across the top of the entire wafer. For example, when multiple MEMS devices 100 are formed in one silicon wafer, sealing layer 112 may be formed as a top layer across all of the MEMS devices on the wafer.

Figure 1G:
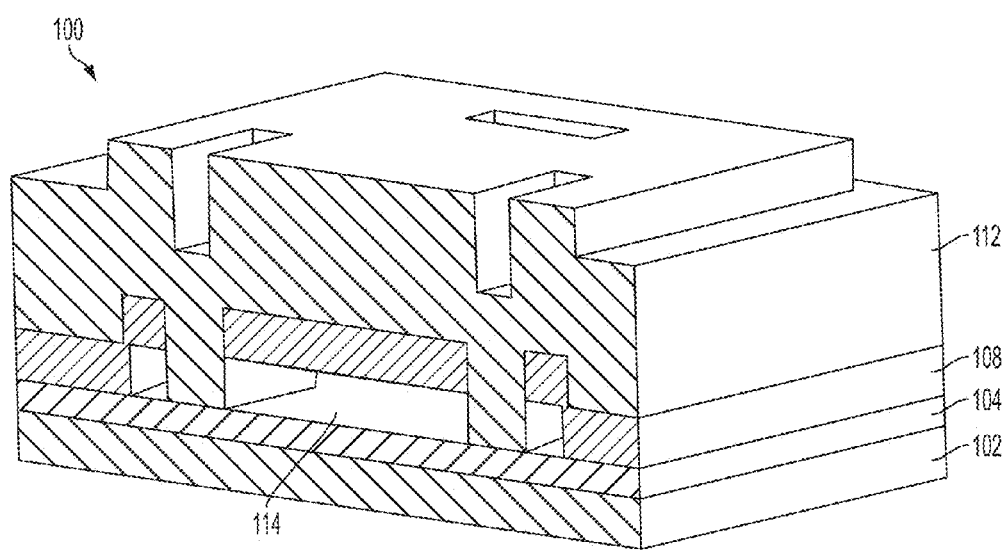
FIG. 1G illustrates in cross-section one embodiment of the present MEMS package.

FIG. 1G illustrates in cross-section an embodiment of the present MEMS device. As shown in the depicted embodiment, hermetic cavity 114 may be formed between insulating layer 104 and packaging layer 108. Also as shown in the depicted embodiment, the formation of sealing layer 112 closes (e.g., seals) the one or more openings 110. In the embodiment shown, sealing layer 112 is deposited such that the sealing layer material does not substantially leak into hermetic cavity 114.

In some embodiments of the present MEMS devices, a resonator may be formed above the insulating layer. FIGS. 2A-2I illustrate (e.g., intermediate) steps in method of packaging a MEMS device 200 with a resonator such that the manufacturing and packaging are performed integrally with one another. MEMS device 200 may be used in radio-frequency (RF) applications. As shown in the depicted embodiment in FIG. 2A, the method of fabrication of a packaged MEMS device with a resonator may begin with silicon wafer 102A, and insulating layer 104A may be formed above the insulating layer 102A. The characteristics and formation of silicon wafer 102A and insulating layer 104A correspond to silicon wafer 102 and insulating layer 104 described earlier.

Figure 2A:
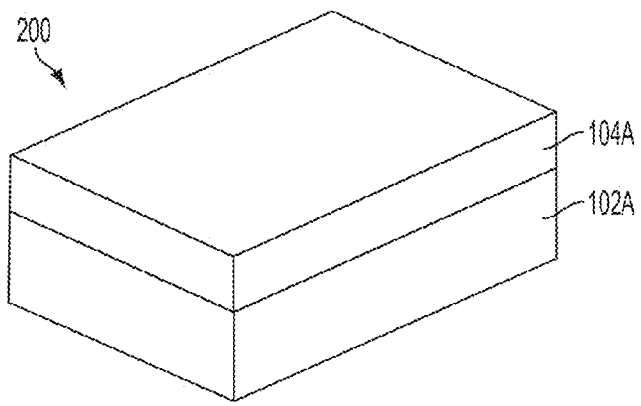
FIGS. 2A-2H illustrate intermediate steps in the fabrication of one embodiment of the present MEMS devices including a resonator.
Figure 2B:
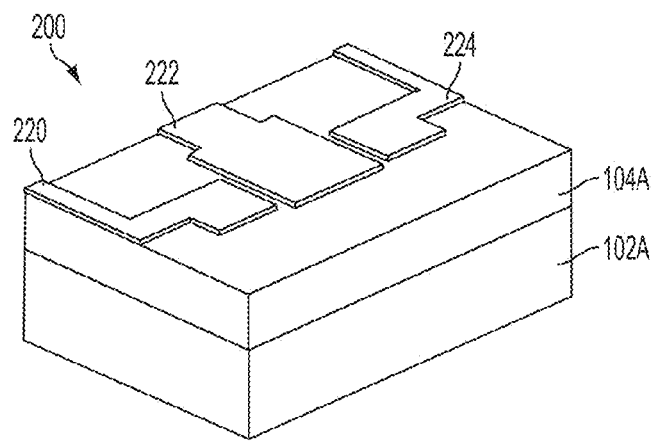

FIG. 2B illustrates an (e.g., intermediate) step in the method of packaging a MEMS device 200. In some embodiments, one or more conductive layers may be formed above the insulating layers. For example, in the depicted embodiment, first anchor 220, electrode 222, and second anchor 224 are formed above the insulating layers. The conductive layers may be formed of metal. In some embodiments, the conductive layers may include titanium (Ti) and gold (Au) layers. In some embodiments, the Ti and Au together may form an approximately 100 nm (e.g., 50 nm to 150 nm) thick conductive layer. In some embodiments, the Ti and Au layers may each be approximately 65 nm thick (e.g., 25 nm to 100 nm). In some embodiments, the formation of the conductive layers may also include the formation of vias and bond pads. These vias and bond pads are discussed in more detail with respect to FIG. 7. The conductive layers may be formed using a lift-off patterning technique, similar to photolithography.

For example, in some embodiments, photoresist NR9-1500PY may be applied using a spin coat process at 2500 rpm (e.g., for 40 seconds). The photoresist may then be baked on a hot plate (e.g., at 150° C. for 60 seconds). Next, the photoresist may be exposed using an OAI mask aligner (e.g. for 16 seconds). The photoresist may be post-baked also on a hot plate (e.g. at 100° C. for 60 seconds) and developed in RD6 (e.g., for 14 seconds). Ti and Au layers may then be formed. (e.g., using a sputtering process.) For example, Ti may be sputtered (e.g., using a 10 mT pressure sputter for 1 minute at 150 W). Au may be sputtering (e.g. using a 10 mT pressure sputter for 70 seconds at 100 W power). To remove excess Ti, Au, and photoresist, the entire wafer may be placed in a 1165 stripper back using ultrasonic agitation (e.g. for 4-5 minutes). Subsequently, the entire wafer may be rinsed in methanol and DI water and dried with nitrogen gas. In some embodiments a Homebuilt brand sputter system may be used.

Figure 2C:
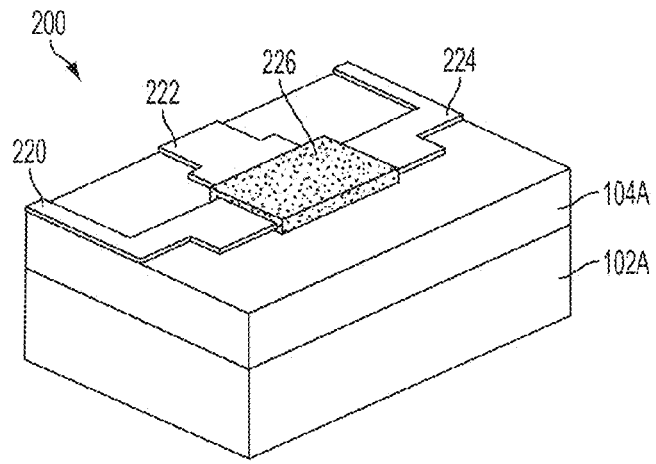

FIG. 2C illustrates an (e.g., intermediate) step in the method of packaging a MEMS device 200. In some embodiments, gap sacrificial layer 226 may be formed above the one or more conductive layers. As shown in the depicted embodiment, gap sacrificial layer 226 (e.g., practically) covers the one or more conductive layers.

For example, gap sacrificial layer 226 may include a polymide layer—such as for example, PI 2737. In some embodiments, the polymide may be diluted. For example, (e.g., 50 grams) thinner T 9039 can be added to (e.g., 100 grams) PI 2737. The mixture may be allowed to stand at room temperature to stabilize. In some embodiments, the gap sacrificial layer may be formed by a spin coating process at 2000 rpm (e.g. for 60 seconds) using the (e.g., diluted) polymide. The gap sacrificial layer may further be baked on a hot plate (e.g. at 70° C. for 3 minutes) and further baked (e.g., at 100° C. for 3 minutes). Subsequently, the gap sacrificial layer may be exposed to the air (e.g., for 16 seconds). The gap sacrificial layer may be developed in DE 9040 and RI 9180. For example, the gap sacrificial layer may be developed in (e.g., 100%) DE 9040 (e.g., for 11 seconds) and then developed in (e.g., 50%) DE 9040 and (e.g., 50%) RI 9180 for (e.g., 11 seconds). The entire wafer may be immersed in a first beaker of RI 9180 (e.g., for 11 seconds), and then subsequently immersed in a second beaker of RI 9180 (e.g., for 11 seconds). The gap sacrificial layer may then be dried with $N_2$ and examined under a microscope.

Forming gap sacrificial layer 226 may comprise a curing process. Curing the gap sacrificial may change its height. For example, the thickness of the gap sacrificial layer before and after curing may be approximately 430 nm and 240 nm, respectively. In other embodiments, the thickness of the gap sacrificial layer before and after curing may be approximately 320 nm and 200 nm, respectively. In some embodiments, the gap sacrificial layer before curing can have a thickness of equal to, greater than, or between, any of: 200, 300, 325, 400, 425, 450, 475, 500, 525, 550, 575, and/or 600 nm. In some embodiments, the gap sacrificial layer after curing can have a thickness of equal to, greater than, or between, any of: 100, 125, 150, 175, 200, 225, 250, 275, 300, 325, and/or 400 nm. In some embodiments, the gap sacrificial layer may be cured in an oven. For example, the layer may be cured (e.g., for one hour with temperature ramping from 25° C. to 300° C.). The gap sacrificial layer may subsequently be cured (e.g., at 300° C. for 3 hours and 45 minutes). The gap sacrificial layer may subsequently cooled (e.g., from 300° C. to 25° C. during a 1 hour ramp down process). For some embodiments, a BLUE-M oven may be used.

Figure 2D:
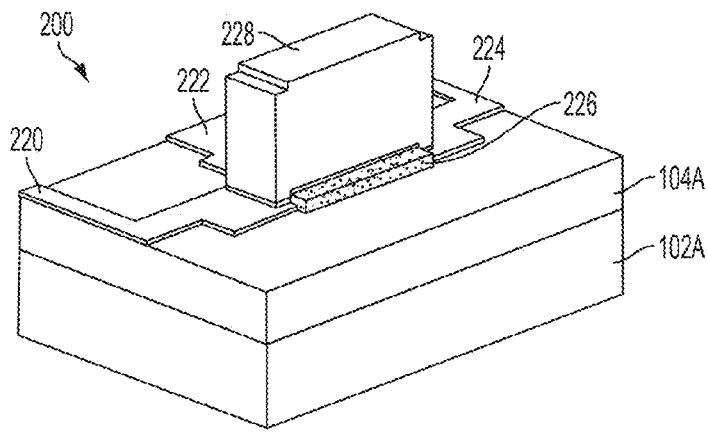

FIG. 2D illustrates an (e.g., intermediate) step in the method of packaging a MEMS device 200. In some embodiments, resonator beam 228 may be formed above gap sacrificial layer 226. In some embodiments, resonator beam 228 may be 1.3 μm thick (e.g. 0.9 to 1.7 μm). In some embodiments, the resonator beam can have a thickness of equal to, greater than, or between, any of: 0.6, 0.7, 0.8, 0.9, 1, 1.2, 1.4, 1.6, 1.8. and/or 2 μm). Resonator beam 228 may also include metal and low-stress aluminum oxide layers. For example, the resonator beam is made up Ti and $Al_2O_3$. As shown in the depicted embodiment, resonator beam 228 may be coupled to first anchor 220 and second anchor 224. The resonator beam may be formed above the gap sacrificial layer and electrode 222. In some embodiments, forming the resonator beam includes a lift-off process similar to photolithography.

For example, in some embodiments, photoresist NR9-1500PY may be applied using a spin coat process at 2000 rpm (e.g. for 30 seconds). The photoresist may be baked on a hot plate (e.g. at 150° C. for 60 seconds). Next, the photoresist may be exposed using an OAI mask aligner (e.g., for 15 seconds). In some embodiments, the photoresist may post-baked on a hot plate (e.g., at 100° C. for 60 seconds) and developed in RD6 (e.g., for 12 seconds). Ti and $Al_2O_3$ may then be deposited using a sputtering technique. The Ti may be sputtered (e.g. using a 10 mT pressure sputter for 5 minutes at 150 W power). The Ti thickness may range from 50-60 nm. In some embodiments, the Ti can have a thickness of equal to, greater than, or between, any of: 30, 35, 40, 45, 65, 70, and/or 75 nm). The $Al_2O_3$ may be sputtered (e.g., using a 10 mT chamber pressure for 20 hours at 150 W power. The $Al_2O_3$ thickness may be 1.1 μm to 1.3 μm. In some embodiments, the $Al_2O_3$ can have a thickness of equal to, greater than, or between, any of: 0.8, 0.9, 1, 1.4, 1.5, and/or 1.6 μm. In some embodiments, the entire wafer may be placed in a 1165 stripper bath for (e.g., for up to 6 hours) to remove the excess photoresist, Ti, and $Al_2O_3$. At this stage, the entire wafer may be rinsed in methanol only and dried with $N_2$ gas.

Figure 2E:
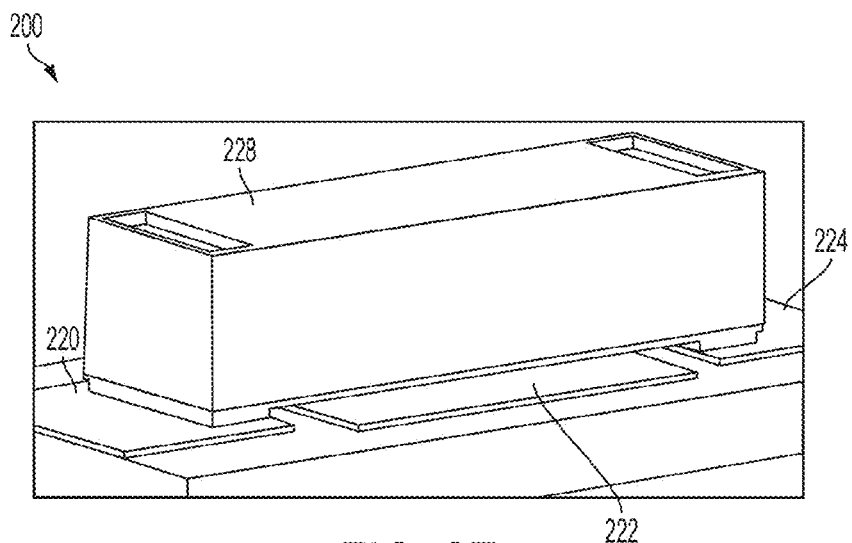

FIG. 2E illustrates an (e.g., intermediate) step in the method of packaging a MEMS device 200. In some embodiments, gap sacrificial layer 226 is removed to form an air gap under resonator beam 228. In some embodiments, the height of gap sacrificial layer 226 determines the height of the air gap under resonator beam 228. As shown in the depicted embodiment, an air gap may exist between electrode 222 and resonator 228. The gap sacrificial layer 226 may be removed using a plasma etching process or an etching process. In some embodiments, the gap sacrificial layer may be removed using an oxygen plasma technique at 150 W and 0.6 mBar chamber pressure using a Diener Asher. Subsequent to removing the gap sacrificial layer, MEMS device 200 may be inspected to verify the removal.

Figure 2F:
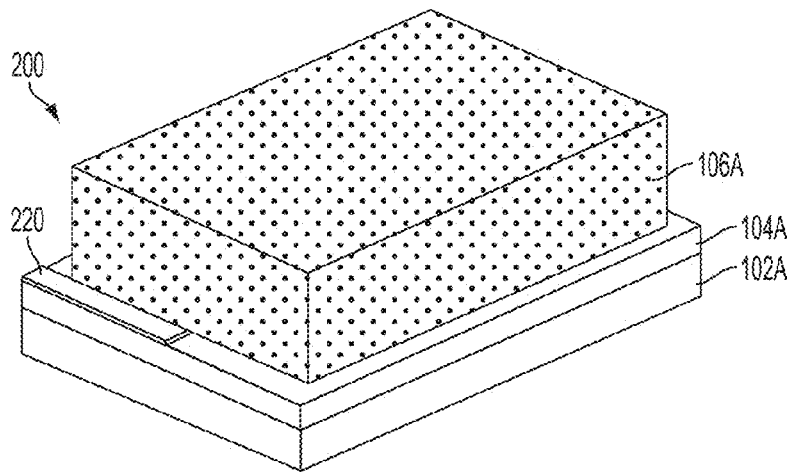
Figure 2G:
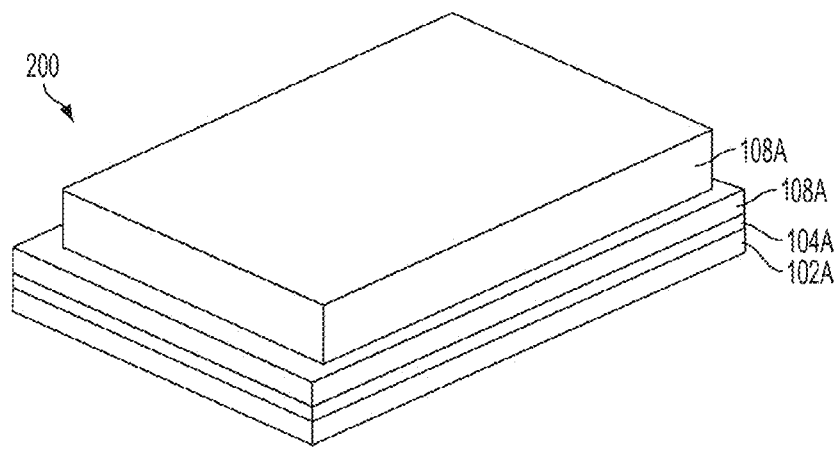
Figure 2H:
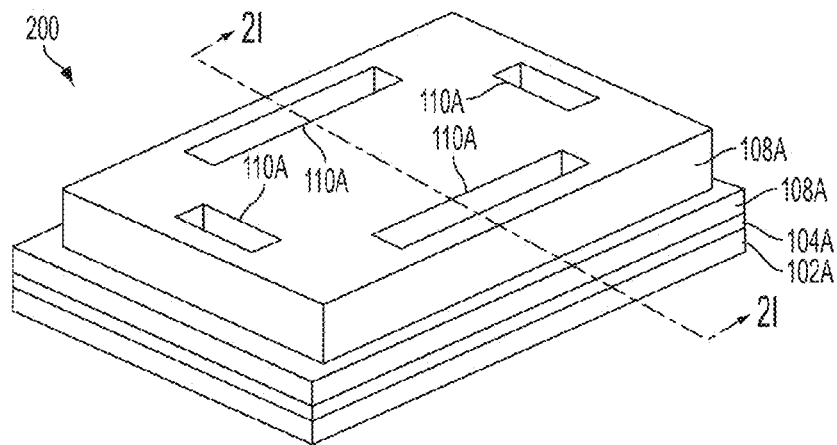

FIGS. 2F, 2G, 2H illustrate (e.g., intermediate) steps in the method of packaging a MEMS device 200. As depicted in FIG. 2F, subsequent to removing gap sacrificial layer 226, chamber sacrificial layer 106A may be formed above insulating layer 104A and resonator beam 228. The formation of chamber sacrificial layer 106A can be substantially similar to that of chamber sacrificial layer 106 above. As depicted in FIG. 2G, packaging layer 108A may be formed above chamber sacrificial layer 106A. The formation of packaging layer 108A can be substantially similar to that of packaging layer 108 described earlier. As depicted in FIG. 2H, one or more openings 110A may be formed in chamber sacrificial layer. The formation of one or more openings 110A can be substantially similar to that of one or more openings 110 above.

Figure 2I:
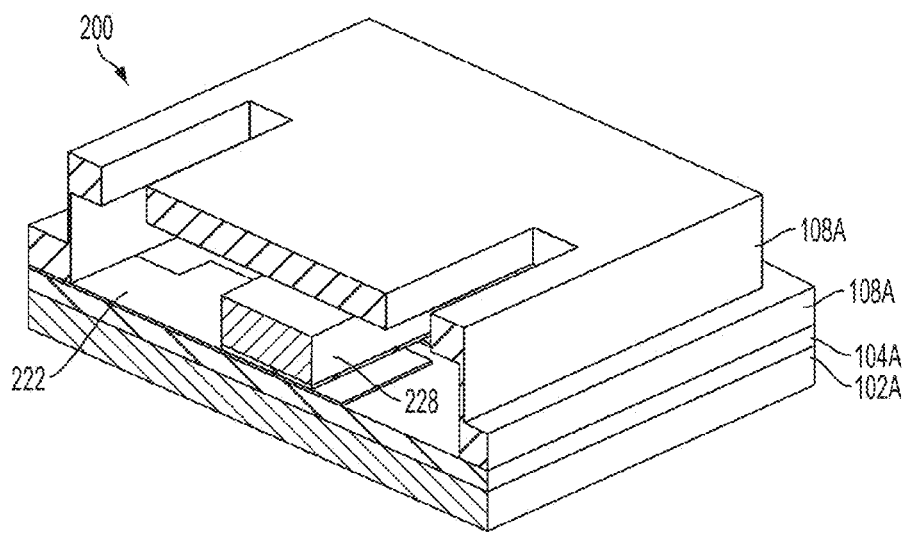
FIG. 2I illustrate in cross-section an intermediate step in the fabrication of one embodiment of the present MEMS devices including a resonator.

FIG. 2I illustrates in cross-section an (e.g., intermediate) step in the method of packaging a MEMS device 200. As depicted in FIG. 2I, chamber sacrificial layer 106A may be removed through one or more openings 110A. The removal of chamber sacrificial layer 106A corresponds to the removal of chamber sacrificial layer 106 described earlier. Subsequent to the removal of chamber sacrificial layer, in some embodiments, a sealing layer is formed above the packaging layer (not shown with respect to FIG. 2). The formation of a sealing layer described here corresponds to the formation of a sealing layer 112 described earlier.

In some embodiments, the steps or portions of the present methods and processes may all be performed within one or more chambers and/or without being exposed to atmospheric pressures. For example, the present MEMS devices may be fabricated within a clean room, and in some embodiments, may be packaged (e.g., a hermetic chamber may be formed) before leaving the clean room. In some embodiments, the present methods and processes may be performed, and/or the present MEMS devices may be packaged, before wafer/die separation. The present MEMS devices may also be integrated with CMOS devices on the same die. In some embodiments, the MEMS devices (or a portion of a MEMS device, such as, a resonator beam) may be packaged (e.g., a hermetic chamber may be formed around the device or portion of the device) before integration with an additional device or devices.

Figure 3:
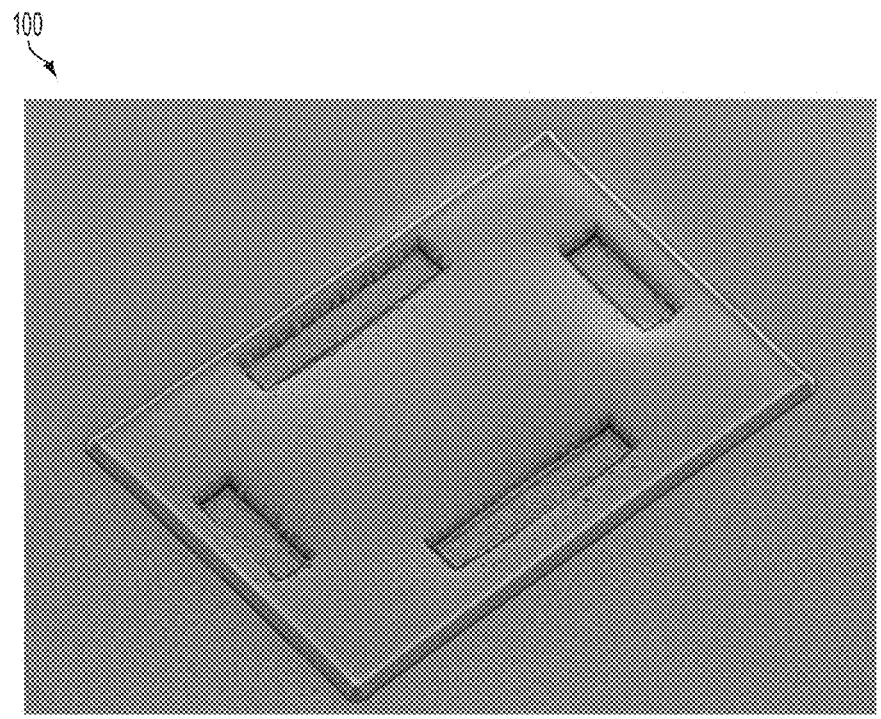
FIG. 3 is an (scanning electron microscope) SEM photograph of the top view of one embodiment of the present MEMS devices.

FIG. 3 is an (scanning electron microscope) SEM photograph of the top view of one embodiment of the present MEMS package 100. As shown in the depicted embodiment, only sealing layer 112 is visible from this top view. The one or more openings have also been sealed by sealing layer 112.

Figure 4:
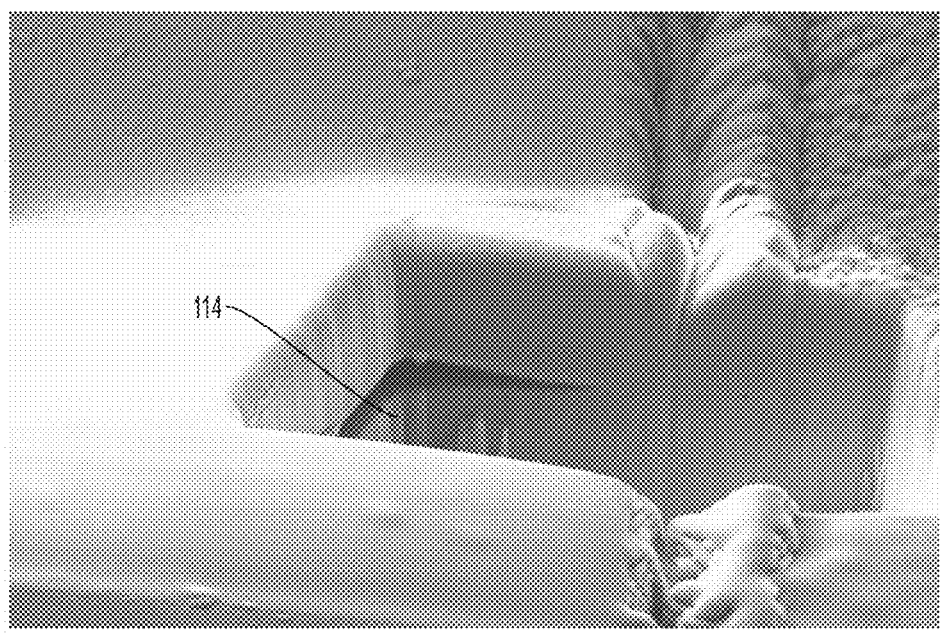
FIG. 4 is an SEM photograph of the hermetic cavity within one embodiment of the present MEMS devices after a focused ion beam (FIB) cut.

FIG. 4 is an SEM photograph of the hermetic cavity within one embodiment of the present MEMS package. For this photograph, after the formation of MEMS package 100, a focused ion beam (FIB) cut was formed to reveal part of the inside of MEMS package 100. As shown in the depicted embodiment, a cavity has been formed within the MEMS package.

Figure 5:
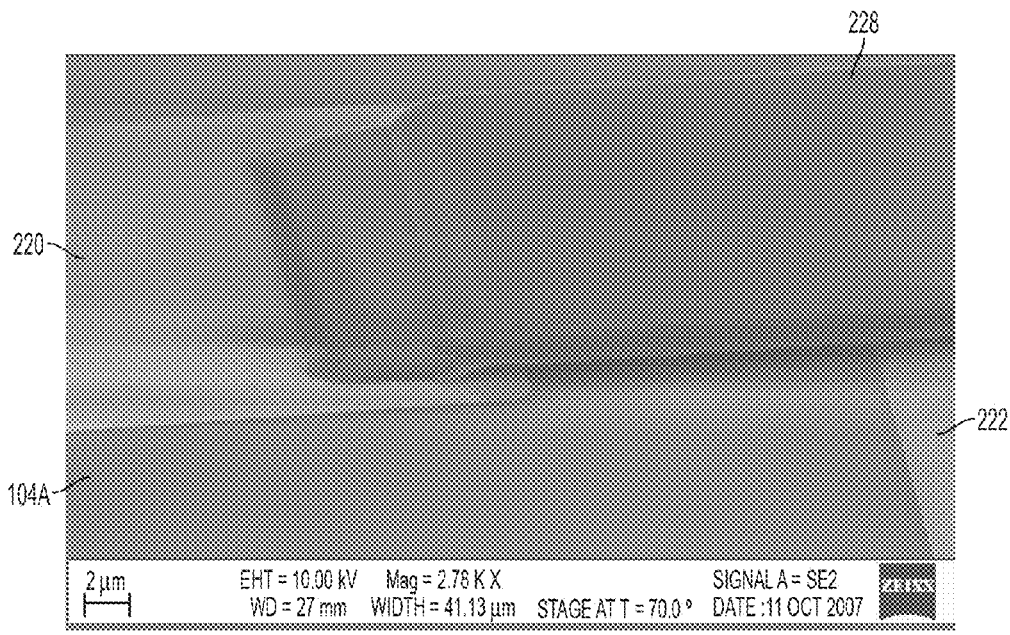
FIG. 5 is an SEM photograph of a resonator within one embodiment of the present MEMS devices.

FIG. 5 is an SEM photograph of resonator 228 within one embodiment of the present MEMS package. As shown in the depicted embodiment, resonator 228 is coupled to first anchor 220 and is partially above electrode 222. Moreover, an air gap has been formed below resonator 228 between resonator 228 and insulating layer 104A. In this embodiment, the resonator beam is 40 µm×60 µm. Additionally, this particular resonator was designed to resonate at 2 MHz.

Figure 6:
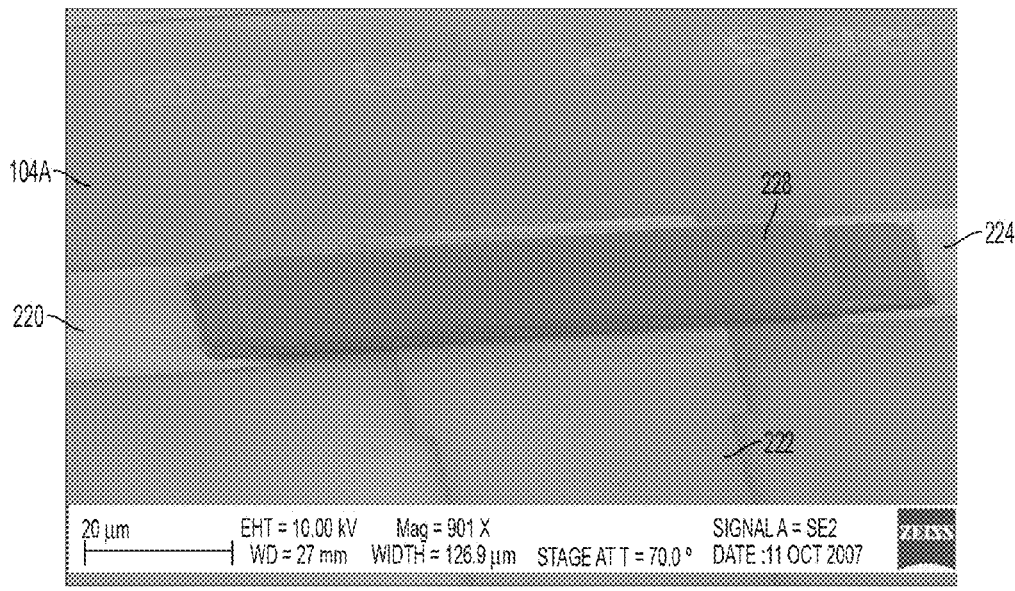
FIG. 6 is an SEM photograph of a resonator within one embodiment of the present MEMS devices.

FIG. 6 is another SEM photograph of the resonator depicted in FIG. 5. As shown in the depicted embodiment, resonator 228 is coupled to first anchor 220 and second anchor 224 and is partially above electrode 222. Moreover, an air gap has been formed below resonator 228 between resonator 228 and insulating layer 104A.

Figure 7:
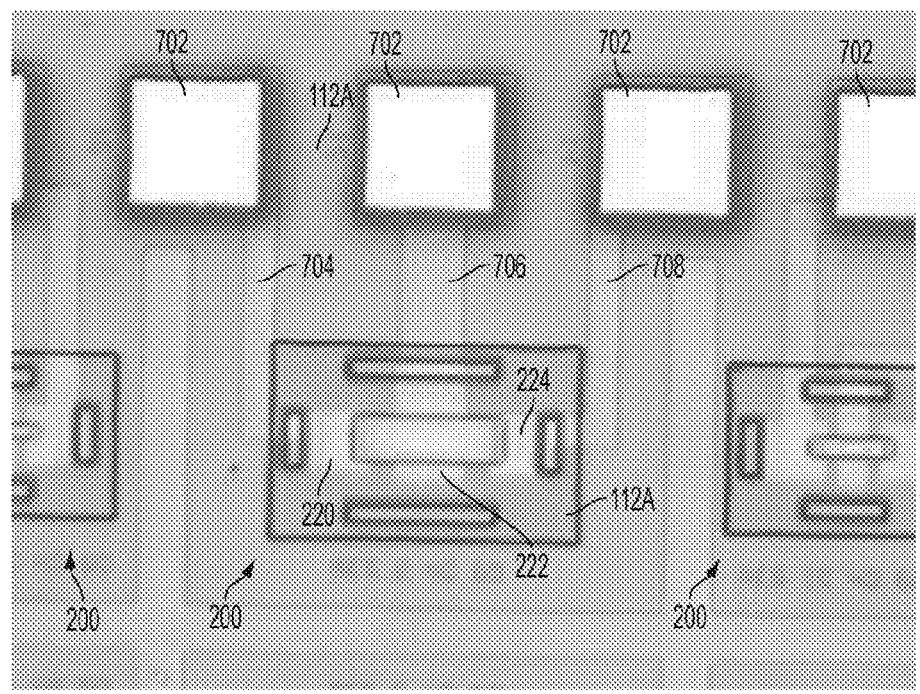
FIG. 7 is an SEM photograph of one embodiment of multiple of the present MEMS devices with open bond pads.

FIG. 7 is an SEM photograph of one embodiment of multiple of the present MEMS packages with open bond pads 704. In some embodiments, sealing layer 112A may be etched to expose a portion of one or more bond pads formed in the one or more conductive layers. As shown in the depicted embodiment, the formation of one or more conductive layers 220, 222, and 224 may further include the formation of conductive vias 704, 706, and 708 to bond pads 702. For example, as shown in the depicted embodiment, first anchor 220 is extended by via 704, electrode 222 is extended by via 706, and second anchor 224 is extended by via 708. The formation of the vias and bond pads may be part of the process used to form the one or more conductive layers described earlier. Sealing layer 112A may be etched by using hydrofluoric acid (HD) may be used expose a portion of the bond pads after the formation of the sealing layer. The HF may be diluted (e.g., to 49%). In other embodiments, the bond pads remain exposed, and no etching process is needed to expose the bond pads. Bond pads 702 may be used to electrically connect to the conductive layers 220, 222, and 224.

FIG. 7 also demonstrates an example of multiple embodiments of a MEMS package being fabricated on one silicon wafer. In the depicted embodiment, at least three MEMS packages have been formed on the wafer. Hundreds of MEMS packages may be formed on one silicon wafer. Also in the depicted embodiment, sealing layer 112A has been formed as the top layer for the entire wafer.

Figure 8:
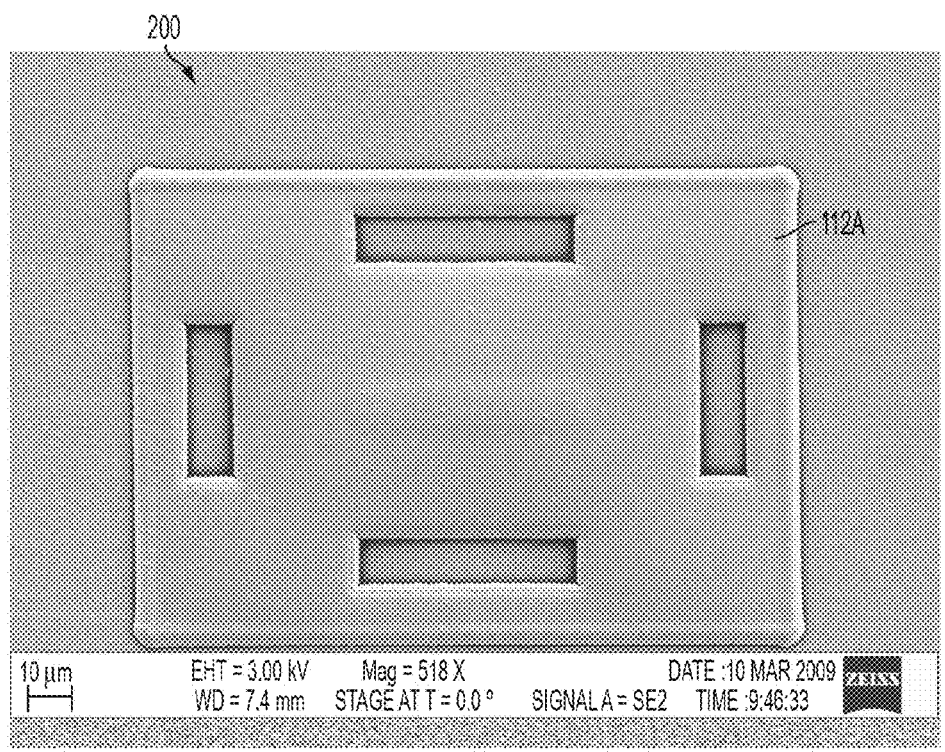
FIG. 8 is an SEM photograph of the top view of one embodiment of the present MEMS devices including a resonator.

FIG. 8. is an SEM photograph of the top view of one embodiment of the present packaged MEMS devices including a resonator. As shown in the depicted embodiment, sealing layer 112A has been formed and the four openings previously formed in the package layer have been sealed. Also visible in FIG. 8 is a small protrusion formed in sealing layer 112A from the resonator located beneath it.

Figure 9:
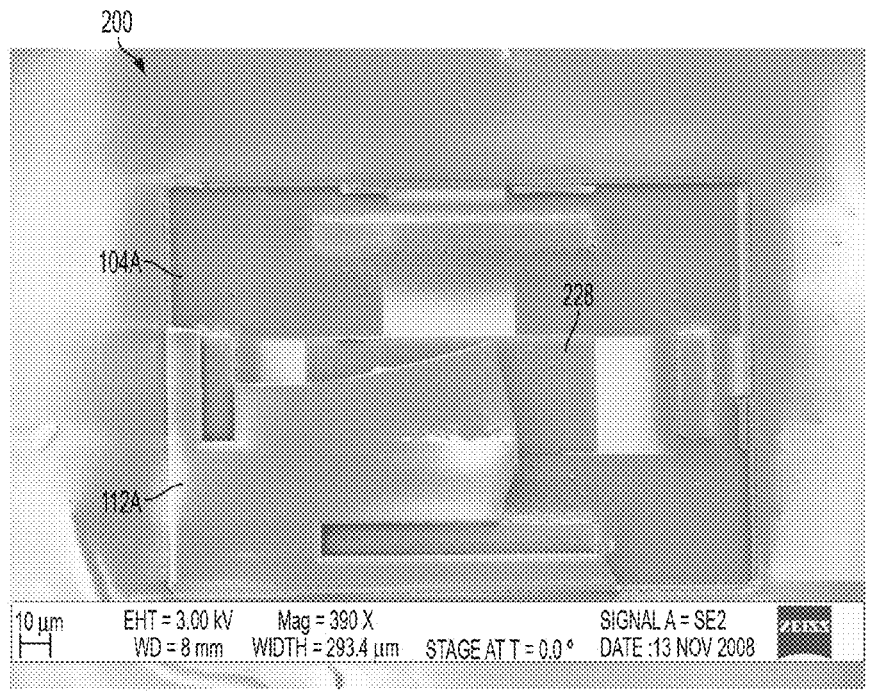
FIG. 9 is an SEM photograph of the top view of one embodiment of the present MEMS with layers partially removed.
Figure 10:
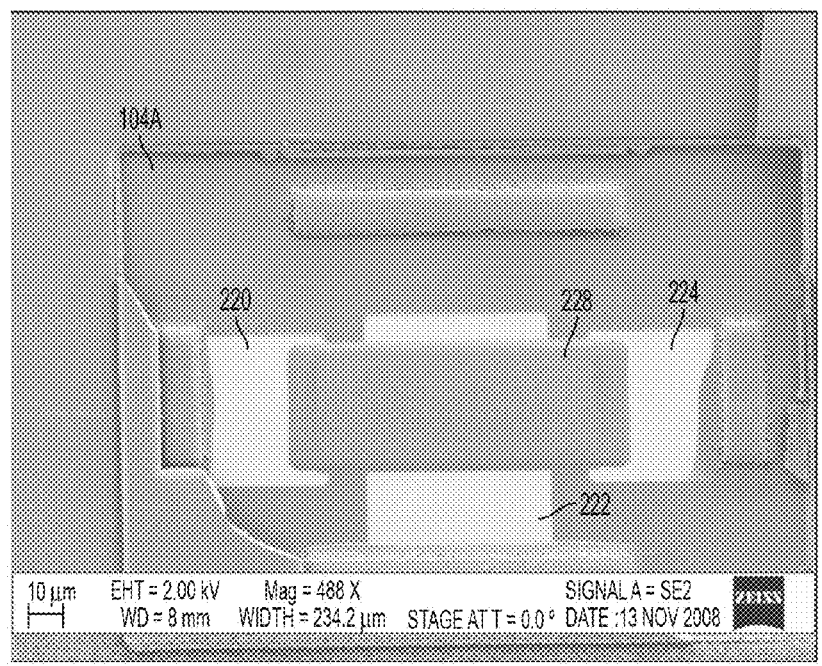
FIG. 10 is an SEM of the top view of one embodiment of the present MEMS devices with layers removed.

FIG. 9 is an SEM photograph of the top view of the embodiment of the MEMS package depicted in FIG. 9 with the packaging and sealing layers partially removed. FIG. 10 is a photograph with the packaging and sealing layers substantially removed. As shown in the depicted embodiment, resonator 228 had been formed and is still intact. Moreover, during the formation of the sealing layer and the sealing of the four openings, the sealing layer did not spread substantially. As a result, even smaller hermetic cavities may be formed that as shown in the depicted embodiment.

Testing and Experimentation

DC and RF characterization of packaged MEMS device 200 were performed at different stages of the fabrication process. DC characterization included measurements of beam resistance and resonator pull-down voltage after forming the resonator. The primary purpose of this measurement was to make sure that the resonator beam was fully released upon removal of gap sacrificial layer 226. Table 1 shows the typical values for the beam resistance and pull down voltage for various resonators, after removing the gap sacrificial layer. The dimension of the package depends on the resonator beam size. The package dimensions of the tested resonator were 145 µm×110 µm, and the dimensions of the resonator beam as-tested were 24 µm×10 µm.

TABLE 1

Beam Resistance and Pull-Down Voltage for Various Resonators

| Resonance Frequency (MHz) | Measured Beam Resistance (Ω) | Pull Down Voltage (V) |
| --- | --- | --- |
| 2 | 180 | 11 |
| 5 | 200 | 21 |
| 10 | 230 | 24 |
| 15 | 250 | 25 |

RF characterization was first performed before packaging (formation of packaging layer 108A and sealing layer 112A). The insertion loss $S_{21}$ was measured on unpackaged resonators as a function of ambient pressure, and the degradation in the quality factor Q with increasing pressure was noted. Additionally, insertion loss was measured at pressures of 25 mTorr, 800 mTorr, 900 mTorr, and 1000 mTorr, and 1 atm. Degradation in the quality factor was observed with each increase in pressure.

Figure 11:
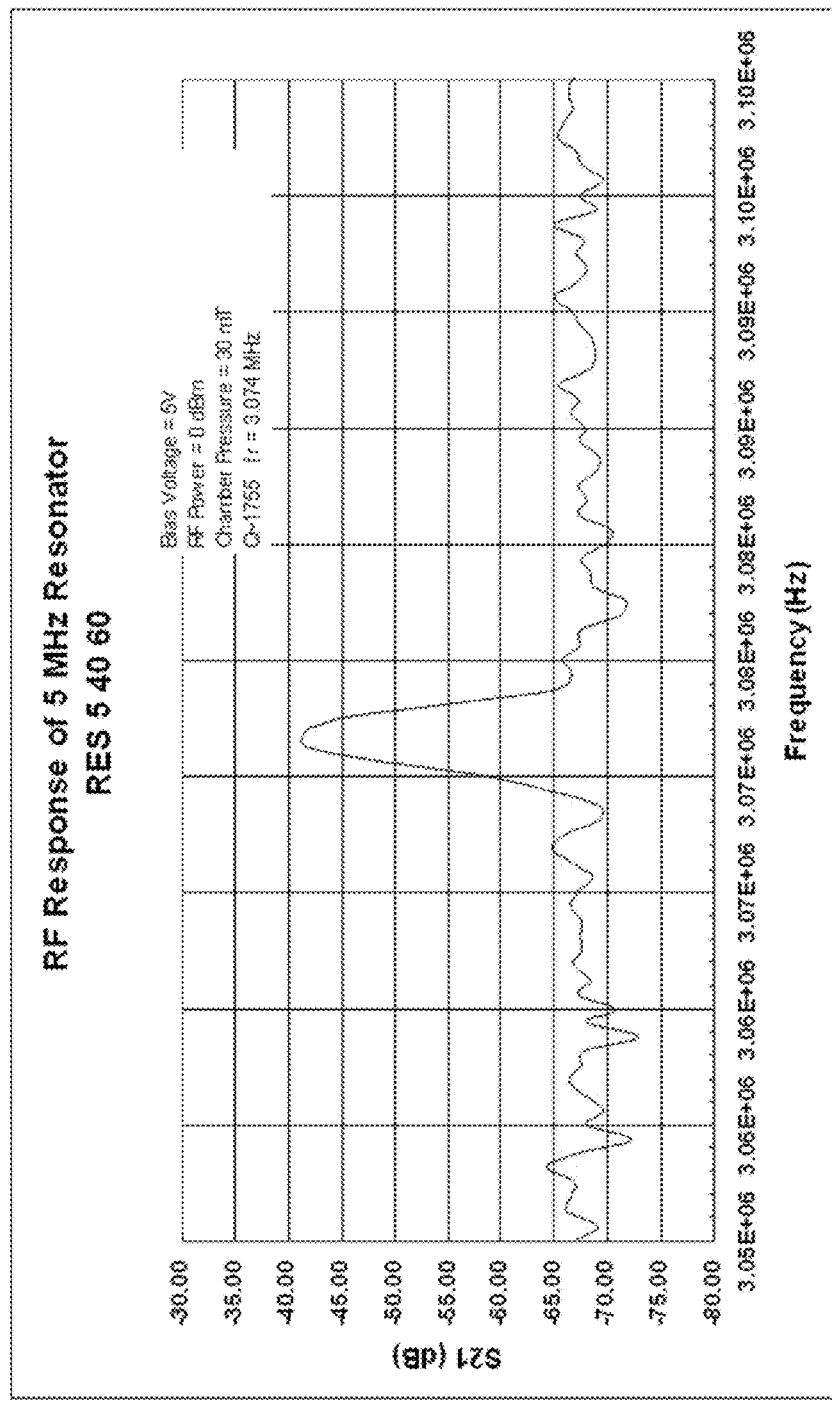
FIG. 11 plots the RF characteristics of one embodiment of the present MEMS devices as a function of frequency.

Completed MEMS packages were also characterized. As depicted in FIG. 11, RF analysis of a MEMS package with a 5 MHz resonator performed in a 30 mTorr chamber pressure demonstrated a resonant frequency of 3.074 MHz. The packaged MEMS device further demonstrated a high Q factor of approximately 1755.

Figure 12:
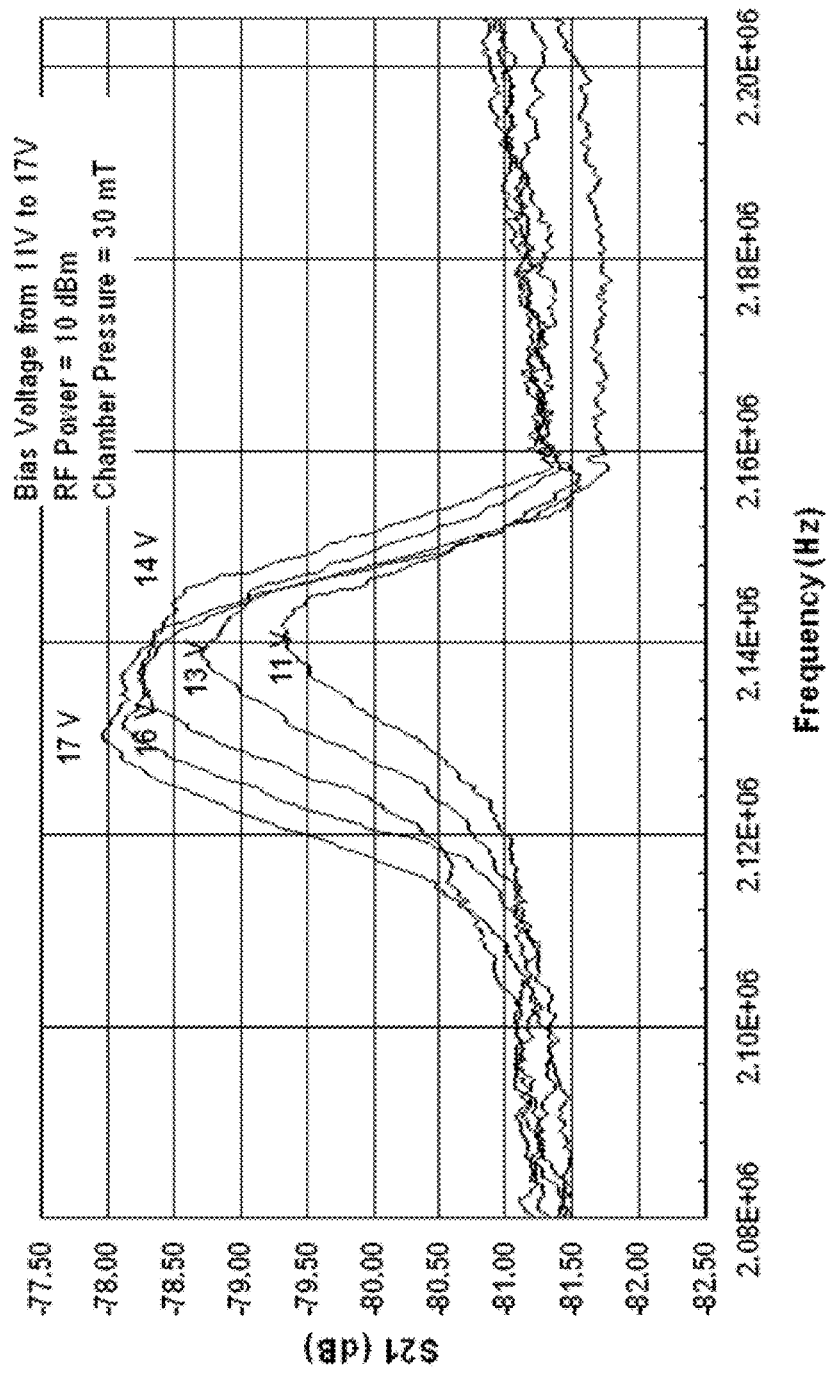
FIG. 12 plots the RF characteristics of one embodiment of the present MEMS devices as a function of frequency using different bias voltages.
Figure 13:
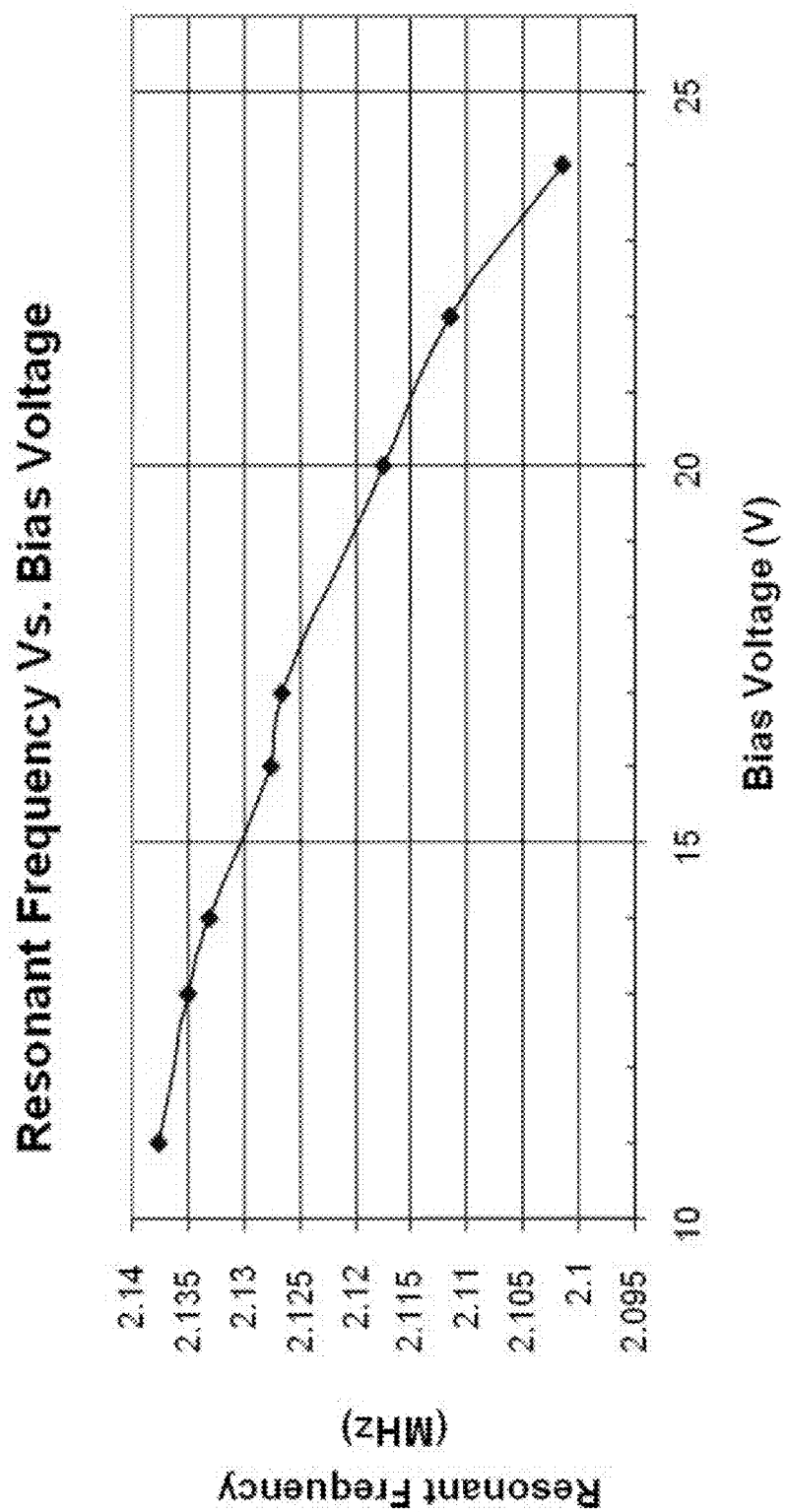
FIG. 13 plots the resonant frequency of one embodiment of the present MEMS devices as a function of increasing bias voltage.

DC tunability of a resonator with a MEMS package may compensate for manufacturing variation and changes in operating or ambient temperature changes. FIGS. 12 and 13 depict that a decrease in the resonant frequency was observed with increasing bias voltage. In FIG. 12, the RF characteristics of packaged MEMS device with a 2 MHz resonator are shown as a function of frequency for varying bias voltage from 11 to 17 V. In FIG. 13, resonant frequency of a MEMS package with a 2 MHz resonator is shown as a function of the bias voltage. In both figures, increasing bias voltage resulted in decreased resonant frequency. One reason for this decrease in resonant frequency may be the decrease in the overall spring constant of the resonator.

The RF response of a MEMS package with a 4 MHz resonator before and after packaging were also analyzed. The measurements were performed at room temperature with a 6.05 V bias voltage and 5 dBm RF power. No resonance was observed for an unpackaged resonator at atmospheric pressure. The $S_{21}$ characteristics were very similar for an unpackaged resonator probed inside a vacuum chamber and when the same resonator was tested in atmosphere after being vacuum packaged. The performance of MEMS package with resonators may be assessed by means of two parameters: the Q factor and the resonant frequency. Both are good indicators of the package quality since the pressure inside the package determines the damping parameter which in turn affects Q and the resonant frequency. The resonant frequency and Q factor did not change after packaging the device, which demonstrated the success of the vacuum-packaging process.

The RF response of a MEMS package with a resonator was also analyzed at different pressures. The resonant frequency and Q factor changed minimally for the MEMS packaged as the pressure of the testing chamber was varied from 35 mTorr to 1 Atm. For example, the resonant frequency of the MEMS package remained at approximately 6.2 MHz with a 6.83 V bias voltage and RF power of 10 dBm.

In order to assess their reliability, the packaged MEMS devices with resonators were subjected to various tests, including extended operating life, high temperature operating life (HTOL), high temperature storage life (HTSL), and temperature cycling.

To test the operating life, an extended 120 hour characterization of a MEMS package with a resonator, held under bias continuously for the duration of the experiment. No change was observed in resonant frequency and Q factor. Since the Q of these devices was limited by pressure, any increase in cavity pressure may result in a corresponding decrease in Q. Therefore, no change in Q may demonstrate that the vacuum inside the cavity remains intact.

For assessment of the high temperature operating life (HTOL), a MEMS package with a resonator was placed for 150 hrs inside a shielded probe station, on a hot chunk maintained at 105° C. at atmospheric pressure and were held under continuous bias. The $S_{21}$ parameter was measured at 0, 72, 96 and 150 hours of continuous operation and compared to that measured at room temperature before and after the stress. Little change was observed with respect to stressing time. A slight change was seen in resonant frequency between room temperature and 105° C., which was probably due to the change in beam stiffness with temperature. The device returned to its original characteristics when the temperature is lowered back to room temperature.

A MEMS package with resonator was also subjected to high temperature storage life (HTSL) measurement, where the MEMS package was kept inside an oven at 110° C. for 1000 hours and the RF characteristics were measured at room temperature after every 250 hours. No change its resonance characteristics was observed.

For thermal cycling, the MEMS package was kept inside an oven where the temperature was cycled between 27° C. and 120° C. The experiment consisted of over 100 cycles, each of 12 hour duration. RF characteristics were measured at room temperature after every 25 cycles. No change was observed in $S_{21}$ characteristics. This result may demonstrate that the package integrity was not compromised over such high temperature gradient. It also may demonstrates that there was no significant outgassing from the package over this temperature profile.

In one test, packaged MEMS devices were dropped while attached to a printed circuit board from three fee height. The drop test simulated the accidental drop, slips, and falls of the package that might be encountered during manual and mechanical handling. Although the MEMS packages displayed considerable visual damage under a SEM, the package remained intact. The RF characteristics and DC tunability of dropped MEMS package resonators also indicated that the present MEMS package can withstand such a freefall. No integrated shock protection was used.

Figure 14:
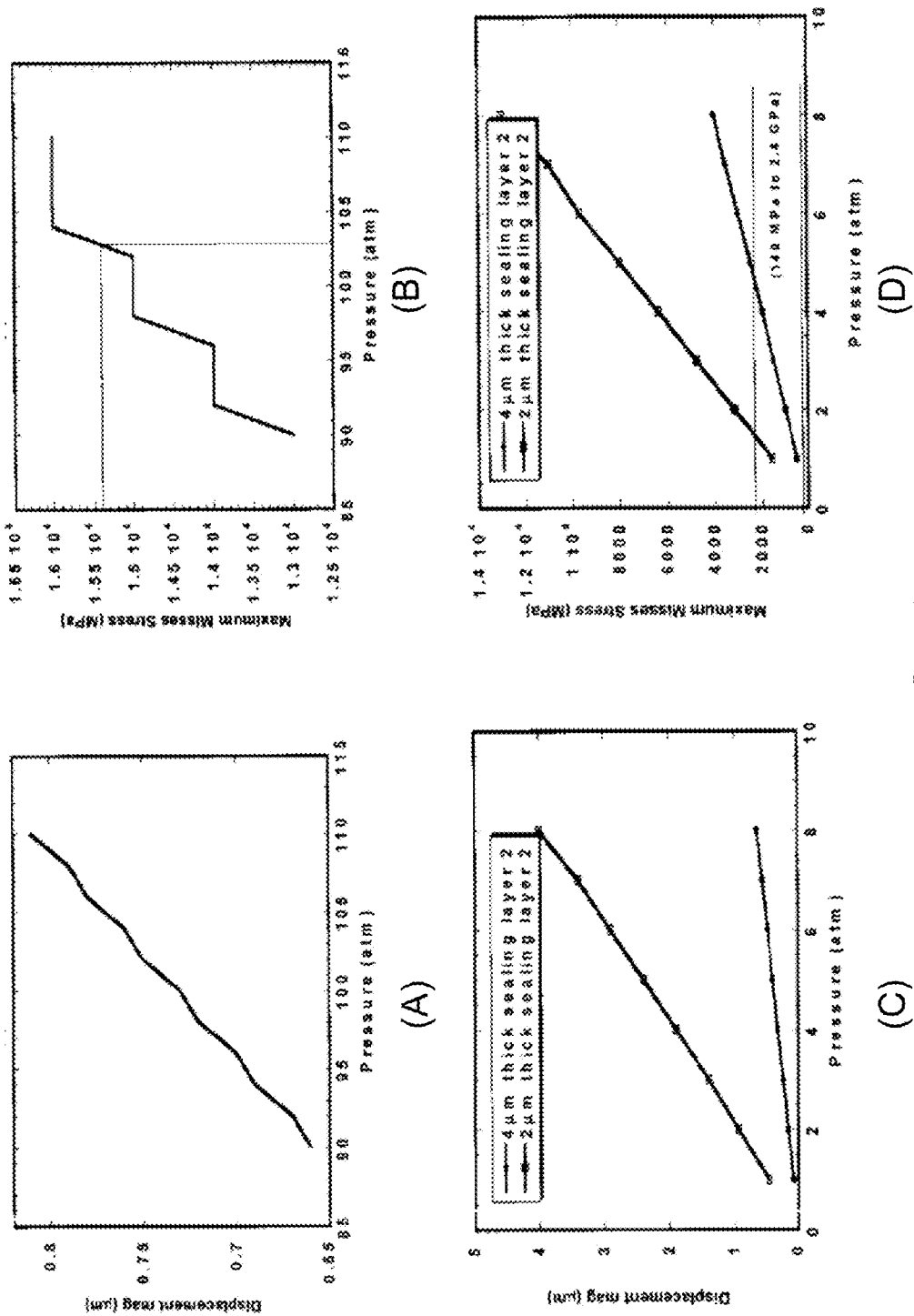
FIGS. 14A-14D illustrate displacement and maximum misses stress versus pressure for two embodiments of the present MEMS device.

FIG. 14A and FIG. 14B depict the mechanical strength of the vacuum cavity for an embodiment of MEMS package 100 (without a resonator). Pressure was applied to the top of the vacuum package and the deflection, maximum misses stress was simulated. As depicted in FIG. 14 B, the yield strength of sealing layer 1 was 15.4 GPa. Moreover, MEMS package 100 may withstand up to 10 MPa, making it an efficient packaging technique.

FIG. 14C and FIG. 14D depict the mechanical strength of the vacuum cavity for an embodiment of MEMS package 200 (with a resonator). The yield strength of the sealing layer was 140 MPa to 2.4 GPa. As shown in FIG. 14D, for a 4 μm thick sealing layer 112A, the MEMS package may withstand up to 500 KPa pressure. Moreover, the MEMS package may withstand higher pressures with thicker sealing layers.

The various illustrative embodiments of the present devices and methods are not intended to be limited to the particular forms disclosed. Rather, they include all modifications, equivalents, and alternatives falling within the scope of the claims. For example, embodiments other than the one shown may include some or all of the features of the depicted embodiment.

The claims are not intended to include, and should not be interpreted to include, means-plus- or step-plus-function limitations, unless such a limitation is explicitly recited in a given claim using the phrase(s) "means for" or "step for," respectively.

References

The following references, to the extent that they provide exemplary procedural or other details supplementary to those set forth herein, are specifically incorporated herein by reference.

[1] M. Esashi, "Wafer level packaging of MEMS," J. Micromechan. Microeng., vol. 18, pp. 1-13, 2008.

[2] H. A. Yang, M. Wu, and W. Fang, "Localized induction heating solder bonding for wafer level MEMS packaging," in IEEE Int. Con! Electro. Meehan. Syst., Maastricht, The Netherlands, Jan. 2004, pp. 729-732.

[3] T. R. Hsu, "Packaging design of Microsystems and mesoscale devices," IEEE Trans. IAdv. Packag., vol. 23, no. 4, pp. 596-601, Nov. 2000

[4] B. Lee, S. Seok, and K. Chun, "A Study on wafer level vacuum packaging for MEMS devices," J. Micromechan. Microeng., vol. 12, pp. 663-669, 2003.

[5] H. A. C. Tilmans, M. D. J. Van de Peer, and E. Beyne, "The indent reflow sealing (IRS) Technique—A method for fabrication of sealed cavities for MEMS devices," J. Microelectromechan. Syst., vol. 9, no. 2, pp. 206-217, Nov. 2000.

[6] A. Mahmood, D. P. Butler, and Z. Celik-Butler, "A device-level vacuum packaging scheme for microbolometers on rigid and flexible substrate," IEEE Sensors J., vol. 7, no. 7, pp. 1012-1019, July 2007.

[7] M. Bartek, J. A. Foerster, and R. F. Wolffenbuttel, "Vacuum sealing of micro cavities using metal evaporation," Sensors Actuators, vol. 46-47, pp. 95-97, 1995.

[8] C. M. Mastrangelo, and R. S. Muller, "Vacuum-sealed silicon micromachined incandescent light source," in Proc. Int. Electron Devices Meeting, 1989, pp. 503-506.

[9] B. Lee, S. Seok, and K. Chun, "A study on wafer level vacuum packaging for MEMS devices," J. Micromech. Microeng., vol. 13, pp. 663-669, 2002.

[10] Y. T. Cheng, L. Lin, and K. Najafi, "Localized silicon fusion and eutectic bonding for MEMS fabrication and packaging," IEEE J. Microelectromech. Syst., vol. 9, pp. 3-8, 2000.

[11] J. Mitchel, G. R. Lahiji, and K. Najafi, "Encapsulation of vacuum sensors in a wafer level package using a gold-silicon eutectic bonding," in Proc. Transducers '05, 2005, pp. 928-931.

[12] J. Mitchel, G. R. Lahiji, and K. Najafi "An improved performance poly-Si pirani vacuum gauge using heat distributing structural supports," IEEE J. Microelectromech. Syst., vol. 17, pp. 93-102, 2008.

[13] H. Kim, and K. Najafi, "Characterization of low-temperature wafer bonding using thin-film parylene," IEEE J. Microelectromech. Syst., vol. 14, pp. 1347-1355, 2005.

[14] D. Sparks, S. Massoud-Ansari, and K. Najafi, "Long term evaluation of hermetically glass flit sealed silicon to Pyrex wafers with feedthroughs," J. Micromech. Microeng., vol. 15, pp. 1560-1564, 2005.

[15] L. Lin, "MEMS post-packaging by localized heating and bonding," IEEE Trans. Adv. Packag., vol. 23, no. 4, pp. 596-601, November 2000.

[16] W.-T. Park, R. N. Candler, S. Kronmueller, M. Lutz, A. Partridge, G. Yama, and T. W. Kenny, "Wafer-Scale film encapsulation of micromachined accelerometers," in Proc. Transducers '03, vol. 2, 2003, pp. 1903-1906.

[17] M. Bartek, J. A. Foerster, and R. F. Wlfenbuttel, "Vacuum sealing of microcavities using metal evaporation," Sensors Actuators A, vol. 16, pp. 364-368, 1997.

[18] T. Tsuchiya, Y. Kageyama, H. Funabashi, and J. Sakata, "Polysilicon vibrating gyroscope vacuum-encapsulated in an on-chip microchamber," Sensors Actuators A, vol. 90, pp. 49-55, 2001.

[19] S. Young, D Weston, B. Dauksher, D. Mancini, S. Pacheco, P. Zurcher and M. Miller, "A novel low-temperature method to fabricate MEMS resonators using PMGI as a sacrificial layer," J. Micromech. Microeng.:vol. 15, pp. 1824-1830, 2005.

[20] S. W. Yoon, N. Yazdi, N. C. Perkins, K. Najafi, "Micromachined Integrated Shock Protection for MEMS," Sensors Actuators A, vol. 130-131, pp. 166-175, 2006.

The invention claimed is:

1. A method of packaging a microelectromechanical systems (MEMS) device, comprising:
   forming a chamber sacrificial layer above an insulating layer that is coupled to a wafer;
   forming a packaging layer above the chamber sacrificial layer;
   forming one or more openings through the packaging layer;
   removing the chamber sacrificial layer through the one or more openings;
   forming a sealing layer above the packaging layer such that the sealing layer substantially seals the one or more openings to form a hermetic cavity;
   forming a resonator above the insulating layer comprising:
      forming one or more conductive layers above the insulating layer;
      forming a gap sacrificial layer above the one or more conductive layers;
      forming a resonator beam above the gap sacrificial layer after forming the one or more conductive layers; and
      removing the gap sacrificial layer to form an air gap under the resonator beam;
   where forming the resonator is performed prior to forming the chamber sacrificial layer.

2. The method of claim 1, where the one or more conductive layers comprises a first anchor, an electrode, and a second anchor.

3. The method of claim 1, where the one or more conductive layers comprise a titanium layer and a gold layer.

4. The method of claim 1, where removing the gap sacrificial layer comprises plasma ashing.

5. The method of claim 1, further comprising:
   etching the sealing layer to expose a portion of one or more bond pads in the one or more conductive layers.

6. A method of packaging a microelectromechanical systems (MEMS) device, comprising:
   forming a chamber sacrificial layer above an insulating layer that is coupled to a wafer;
   forming a packaging layer above the chamber sacrificial layer;
   forming one or more openings through the packaging layer;
   removing the chamber sacrificial layer through the one or more openings; and
   forming a sealing layer above the packaging layer such that the sealing layer substantially seals the one or more openings to form a hermetic cavity;
   where forming the sealing layer comprises forming a layer of $Al_2O_3$ at a pressure of less than 10 Torr.

* * * * *